(12) United States Patent
Liu et al.

(10) Patent No.: US 6,930,928 B2
(45) Date of Patent: Aug. 16, 2005

(54) METHOD OF OVER-ERASE PREVENTION IN A NON-VOLATILE MEMORY DEVICE AND RELATED STRUCTURE

(75) Inventors: Chen Chin Liu, Hsinchu (TW); Cheng Sheng Pan, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/683,304

(22) Filed: Oct. 10, 2003

(65) Prior Publication Data

US 2005/0078527 A1 Apr. 14, 2005

(51) Int. Cl.[7] .............................................. G11C 16/04
(52) U.S. Cl. .......................... 365/185.29; 365/185.22; 365/185.28
(58) Field of Search .................. 365/185.29, 185.3, 365/185.28, 185.24, 185.22

(56) References Cited

U.S. PATENT DOCUMENTS 6,201,737 B1 * 3/2001 Hollmer et al. ........ 365/185.16
6,445,030 B1 * 9/2002 Wu et al. .................... 257/315
6,580,643 B1 * 6/2003 Satoh et al. ........... 365/185.22

* cited by examiner

*Primary Examiner*—Gene N. Auduong
(74) *Attorney, Agent, or Firm*—Stout, Uxa, Buyan & Mullins, LLP

(57) ABSTRACT

A method for enhancing erase of a non-volatile memory device in which the method prevents the over-erase of the memory device is disclosed. The disclosed method includes steps which are performed to precondition the memory device before a program or erase cycle is initiated. The method includes performing a step which includes a tunneling program, such as a Fowler-Nordheim (F-N) tunneling program, to increase the threshold voltage of the non-volatile memory device prior to performing the program/erase cycle. The disclosed method has particular applicability to a non-volatile memory device formed with an NROM device. The disclosed method attenuates or eliminates an over-erase condition in the non-volatile memory device. The related structure that is present in the preconditioning step is also disclosed.

14 Claims, 3 Drawing Sheets

METHOD OF OVER-ERASE PREVENTION IN A NON-VOLATILE MEMORY DEVICE AND RELATED STRUCTURE

BACKGROUND OF THE INVENTION

1. Field of the Invention

The present invention relates to memory devices and, more particularly, to methods of treating over-erase conditions of non-volatile memory devices.

2. Description of Related Art

Semiconductor devices typically include multiple individual components formed on or within a substrate. One such component is a memory device, which is used to store electronic data such as computer programs executed by an electronic processor and logical data operated on by the processor. Memory devices that do not require ambient power to store electronic data are commonly referred to as non-volatile memory devices. The read-only memory (ROM) is a non-volatile memory device commonly used in electronic equipment such as microprocessor-based digital electronic equipment and portable electronic devices such as cellular phones.

ROM devices are conventionally arranged into a plurality of memory cell arrays. Each memory cell includes a transistor, which typically comprises a metal-oxide-semiconductor field effect transistor (MOSFET) that is juxtaposed between two intersecting bit lines and a word line. Data bit values or codes held by these memory cell transistors are permanently stored (until deliberate erase) in the physical or electrical properties of the individual memory cells. Generally speaking, a consequence of the non-volatile nature of a ROM is that data stored in the memory device can only be read.

Programmable non-volatile memory is a specific form of non-volatile memory in which bits of logical data can not only be read but can also be written (e.g., programmed) into memory cells. In general, a grouping of memory cells can be termed a word, a grouping of words can be termed a page, and a grouping of pages can be termed a sector. Data may be accessed for reading and programming (i.e., writing) by word or page, while an entire sector is commonly accessed for erasing.

Three commonly-known types of these nonvolatile ROMs are erasable programmable ROMs (EPROMs), electrically erasable programmable ROMs (EEPROM), and flash EEPROMs, which are commonly referred to as flash memories. These all can be written to by one of two ways. The first is by channel hot electron (CHE) injection. This is accomplished by injecting electrons to modify the voltage at a transistor's floating gate. The second method of writing employs a field emission mechanism known as Fowler-Nordheim (F-N) tunneling. Fowler-Nordheim tunneling is the process whereby electrons tunnel through a barrier in the presence of a high electric field. This quantum mechanical tunneling process is an important mechanism for thin barriers such as those in metal- or oxide-semiconductor junctions on highly-doped semiconductors. F-N tunneling is achieved by applying a field across the insulating barrier to make it transparent for electrons to pass through. Erasing the above memories can be performed for example by either F-N tunneling or by exposing them to ultraviolet light. EPROMs can use CHE for writing and ultraviolet light for erasing. EEPROMs can use F-N tunneling for both writing and erasing. Flash memories can use CHE for writing and F-N tunneling for erasing.

A conventional floating gate-based flash memory device (e.g., a floating gate-based EEPROM) includes a transistor characterized by a programmable threshold voltage ($V_t$). The transistor's threshold voltage can be set, or programmed, to a desired value along an analog scale between the maximum and minimum threshold voltage limits that are determined based on the design parameters of the transistor. The transistor typically comprises a stacked gate structure on a semiconductor substrate. The stacked gate structure includes a relatively thin tunnel oxide (i.e., silicon dioxide) that overlies the substrate. It also includes a doped polysilicon floating gate that overlies the tunnel oxide and an interpoly dielectric that overlies the floating gate. Lastly, a doped polysilicon control gate overlies the interpoly dielectric. The transistor also comprises source and drain regions that are self-aligned to the sidewalls of the stacked gate structure.

In general, a floating gate-based flash memory device can be programmed by inducing electron injection from either the source region or the drain region, depending upon the applied voltage bias, to the floating gate. Electrons pass through the tunnel oxide to the floating gate by a mechanism known as Fowler-Nordheim (F-N) tunneling. After sufficient negative charge accumulates on the floating gate, the negative potential of the floating gate raises the threshold voltage of the associated field effect transistor (FET) and inhibits current flow through the channel region during a subsequent "read" mode. The act of discharging the floating gate, (i.e., the erase function), can be carried out by inducing the electrons stored in the floating gate to move to the source region. There are numerous ways to move electrons to or from the floating gate. For example, the electrons can be electrically drawn or, alternatively, they can be drawn using ultraviolet radiation.

A relatively recent development in non-volatile memory has been the advent of localized trapped charge devices. While these devices are commonly referred to as nitride read-only memory (NROM) devices, the acronym "NROM" is part of a combination trademark of Saifim Semiconductors Ltd. (Netanya, Israel). NROM devices offer a number of advantages over the 30 year old currently dominant floating gate devices such as EPROM, Flash, and EEPROM, which store charge in a conductive floating gate.

Each memory device of a localized trapped charge array is typically an n-channel MOS (nMOS) transistor with an oxide-nitride-oxide (ONO) dielectric structure forming the gate dielectric. Data is stored in two separate locations adjacent to the source and drain terminals of the nMOS transistor, allowing 2 bits of data to be stored in the nMOS transistor structure.

A localized trapped charge memory device (e.g., NROM-based device) may be typically programmed by channel hot electron (CHE) injection through bottom oxide layers of the ONO dielectric structures. That is, by inducing electron injection from the drain region to the charge trapping layer. Electrons pass through the tunnel oxide to the charge trapping layer by the mechanism of F-N tunneling mentioned earlier. During programming, electrical charge is trapped in the charge trapping layer. Since this charge trapping layer comprises a non-conductive or low conductivity material (e.g., silicon nitride), as well as because of the relatively low lateral electric field in the charge trapping layer, the individual electrical charges do not migrate within the charge trapping layer.

The localized trapped charge memory device may be erased by tunneling enhanced hot hole (TEHH) injection. In the TEHH injection mechanism, holes are generated by band-to-band tunneling under the ONO dielectric structure in the junction. The kinetic energy of the holes is increased due to a lateral electric field, allowing some holes to be injected into the ONO dielectric structure, assisted by a vertical electric field. Once in the ONO dielectric structure, the holes combine with stored electrons. An erase cycle may be performed with a positive voltage scheme, with a positive voltage bias from the drain to the source, and with the gate being grounded. Alternatively, a positive voltage may be applied to the drain, and a negative voltage to the gate. The NROM-based device operates as a localized charge storage device, in which the trapped charge remains only at the injection point. Thus, NROM-based devices can be less susceptible to single bit failures commonly experienced by some floating gate technologies, and the occurrence of these types of failures may be reduced. Scaling reduction (i.e., reduction in size) may allow for further minimization of overall device size and increased device density without degradation in performance.

A troublesome problem associated with localized trapped charge memory devices can be that of "over-erase." Generally, over-erase can occur for example when a cell's or bit's threshold voltage is lowered during an erase operation to the point where it cannot be sufficiently turned off when de-selected following the erase operation. In the context of an NROM-based memory device, an over-erase condition can result from the removal of too many electrons from the charge trapping layer of the NROM-based memory device. For instance, an over-erase condition can occur in an NROM-based memory device when more electrons are removed from a charge trapping layer than were placed there by a previous cell protocol.

It would thus be advantageous to have a method of erase applicable to a non-volatile memory device, such as an NROM-based device, in which an over-erase condition can be attenuated or altogether eliminated.

SUMMARY OF THE INVENTION

Method for programming and erasing a non-volatile memory device are disclosed. The methods can includes step which precondition the memory device before a program/erase cycle is initiated. The method includes performing a step which includes a tunneling program, such as an F-N tunneling program, to increase a threshold voltage of the non-volatile memory device prior to performing a program and/or erase cycle. The method has particular applicability to a memory device formed with an NROM device. In this manner an over-erase condition may be prevented.

As described herein, a pre-erase mechanism of a non-volatile memory device includes the temporary formation of a structure in which the tunneling program has caused electrons to be injected into the trapping layer to counter or compensate for an over-abundance of holes that may be added into the trapping layer via an over-erase operation of the non-volatile memory device. This structure thus represents a memory device in which the threshold voltage has been increased sufficiently so that an over-erase condition can be overcome.

In accordance with one aspect of the present invention, a method is provided for enhancing erase of a memory device having a localized trapped charge memory device structure, the method comprising: providing a memory device, the memory device having a characteristic threshold voltage; performing a program to increase the threshold voltage of the memory device before a program cycle or an erase cycle; and then performing the program cycle or the erase cycle.

In accordance with another aspect of the present invention, a programmable, read-only memory device is provided, the device comprising: two diffusion areas in a substrate and a channel formed therebetween; a first insulating layer having a given thickness; a non-conducting charge trapping layer having a thickness of 100 angstroms or less overlaying the first insulating layer; a second insulating layer having a thickness that is on the same order of magnitude as the first insulating layer, the second insulating layer overlaying the charge trapping layer; a gate at least above the second insulating layer; a plurality of over-erase injected holes within the trapping layer; and a plurality of injected electrons distributed in the trapping layer; wherein the plurality of injected electrons is of substantially the same order of magnitude as the plurality of over-erase injected holes.

In accordance with another aspect of the present invention, a method is provided for preventing the over-erase of an NROM device, comprising the steps of providing an NROM device, the NROM device having a characteristic threshold voltage; performing a Fowler-Nordheim (F-N) tunneling program to increase a threshold voltage of the NROM device before a program/erase cycle; and performing the program/erase cycle.

Any feature or combination of features described herein are included within the scope of the present invention provided that the features included in any such combination are not mutually inconsistent as will be apparent from the context, this specification, and knowledge attributable to one of ordinary skill in the art. For purposes of summarizing the present invention, certain aspects, advantages and novel features of the present invention are described herein. Of course, it is understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
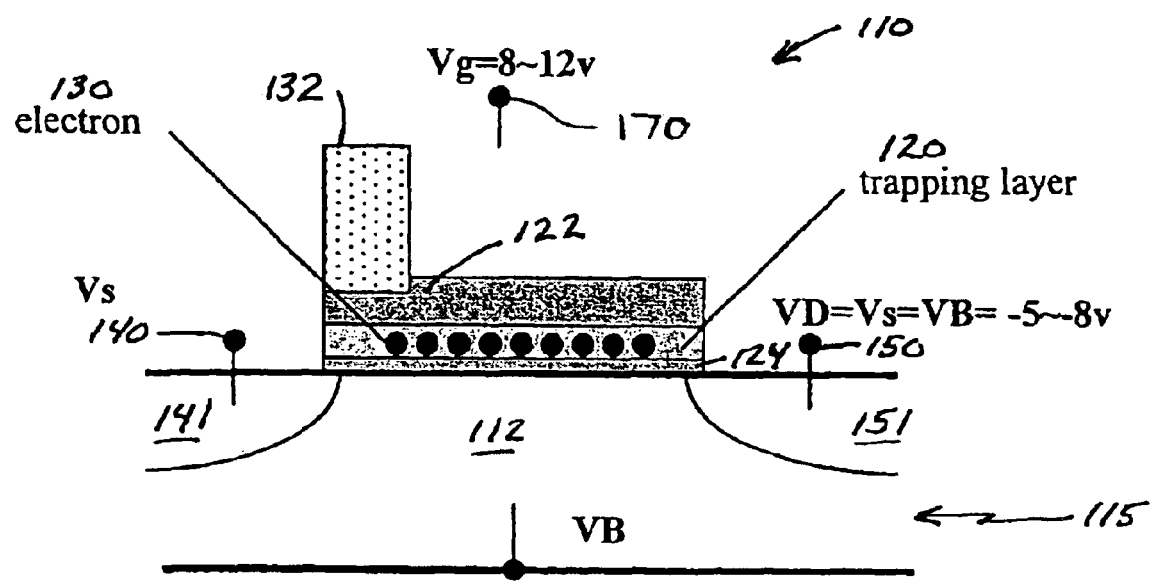
FIG. 1 is a sectional view of a localized trapped charge memory device structure formed on a semiconductor substrate prior to programming of the memory device.

Reference will now be made in detail to the presently preferred embodiments of the invention, examples of which are illustrated in the accompanying drawings. Wherever possible, the same or similar references numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, overlying, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be further understood and appreciated that the process steps and structures described herein do not cover a complete process flow for the enhanced erase of localized trapped charge memory device structures so as to attenuate or eliminate an over-erase condition. The present invention may be practiced in conjunction with various integrated circuit operation techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to localized trapped charge memory device structures and methods of programming and/or erasing such structures.

It should be further noted that throughout the discussion of the memory device of the invention presented herein, the voltage levels discussed in connection therewith are exemplary and are assumed to be independent of the power supply voltage. Thus, the power supply voltages supplied to the chip embodying the memory device may vary while the voltages applied to the gate, drain and source thereof will be supplied from regulated voltage sources. There are numerous ways to move electrons to or from the charge trapping layer.

A program/erase cycle can be a program cycle, an erase cycle, or a process of programming which includes writing followed by reading. To program a localized trapped charge memory device, a short programming pulse can be applied to the NROM or other non-volatile memory device in order to, for example, induce electron injection from the drain region to the charge trapping layer thereby raising a threshold voltage ($V_t$) of the memory device, followed by an optional read operation. The read operation can actually be used to effectively measure the gate threshold voltage. The gate threshold voltage can be measured, for example, by applying a voltage to the drain and a separate voltage to the gate, with the voltage on the gate being increased from zero while the channel current flowing from drain to source is measured. For example, the gate voltage that provides 1 $\mu A$ of channel current can be termed the threshold voltage.

Programming pulses (i.e., write pulses) are typically followed by read cycles wherein the read is performed in the same direction that the programming pulse is applied. This protocol is termed symmetrical programming and reading. Programming stops, for example, when the gate threshold voltage has reached a certain predetermined point (e.g., the channel current is reduced to a sufficiently low level). This point is chosen to ensure that a '0' bit can be distinguished from a '1' bit and that a certain data retention time has been achieved.

In connection with programming and reading operations, data can be cleared from a memory device by implementing an erase procedure wherein, for example, electrons stored in the charge trapping layer are induced to move to the source region thereby lowering the threshold voltage. Over-erase occurs when a memory device's threshold voltage is lowered during an erase operation to a point where the memory device cannot be sufficiently turned off when de-selected following the erase operation.

The present invention provides a method for programming and/or erase of a trapped charge layer memory device, such as a representative nitride read-only memory (NROM) device 110 illustrated in FIG. 1, which method can attenuate or overcome an over-erase condition. The illustrated NROM device 110 comprises a first insulating layer, which in the illustrated embodiment is a first oxide layer 124, and a charge trapping layer 120. The charge trapping layer 120 comprises a non-conducting or low conductivity material, such as silicon nitride. Charge trapping layer 120 overlies first oxide layer 124. A second insulating layer, which in the illustrated embodiment is a second oxide layer 122, overlies charge trapping layer 120. In combination, first oxide layer 124, charge trapping layer 120, and second oxide layer 122 form an oxide-nitride-oxide (ONO) dielectric structure. Charge trapping layer 120 comprises two charge storage areas wherein charges are storable to represent two bits of data. However, the dimension of charge storage area is sufficiently narrow to enable stored charge therein to be erased during an erase cycle.

NROM device 110 further comprises first and second diffusion areas, which are represented in FIG. 1 by source region 141 and drain region 151, respectively. Source region 141 and drain region 151 are disposed symmetrically with respect to one another in the illustrative embodiment described herein, although this symmetry is not a required condition, and other spatial relationships are contemplated.

NROM device 110 of FIG. 1 represents an NROM device prior to programming of the device. Charge trapping layer 120 includes a plurality of electrons 130 distributed throughout the trapping layer 120, illustrating an embodiment of charge trapping layer 120 prior to programming of NROM device 110. To program NROM device 110 a technique such as channel hot electron (CHE) injection is used. In the CHE injection technique, voltages are applied to a drain 150 and a gate 170, while a source 140 is grounded. For example, approximately 8 to 12 V is applied to the gate 170 and approximately −5 to −8 V is applied to the drain 150. These voltages generate a vertical and lateral electric field along the length of the channel 112 from the source 140 to the drain 150. This electric field causes electrons to be drawn off the source 140 and begin accelerating toward the drain 150. As the electrons move along the length of the channel 112, they gain energy. If the electrons gain sufficient energy, they are able to jump over the potential barrier of the oxide layer 124 into a charge trapping layer 120 comprising, for example, silicon nitride, and become trapped therein as represented by electrons 130. The probability of this occurring is a maximum in the region of the channel 112 next to the drain 150, because it is near the drain 150 that the electrons have the most energy. These accelerated electrons are termed "hot electrons," and once injected into the charge trapping layer 120 they become trapped and remain stored therein. The trapped electrons 130 cannot spread through the charge trapping layer 120 because of the low conductivity of the material comprising the charge trapping layer 120 and the relatively low lateral electric field in the charge trapping layer 120. Thus, the trapped charge (i.e., electrons 130) remains in a localized trapping region in the charge trapping layer 120, typically located close to the drain 150. NROM device 110 further includes a conductive contact 132 for connection to and/or interrogation by other suitable remote devices.

Figure 2:
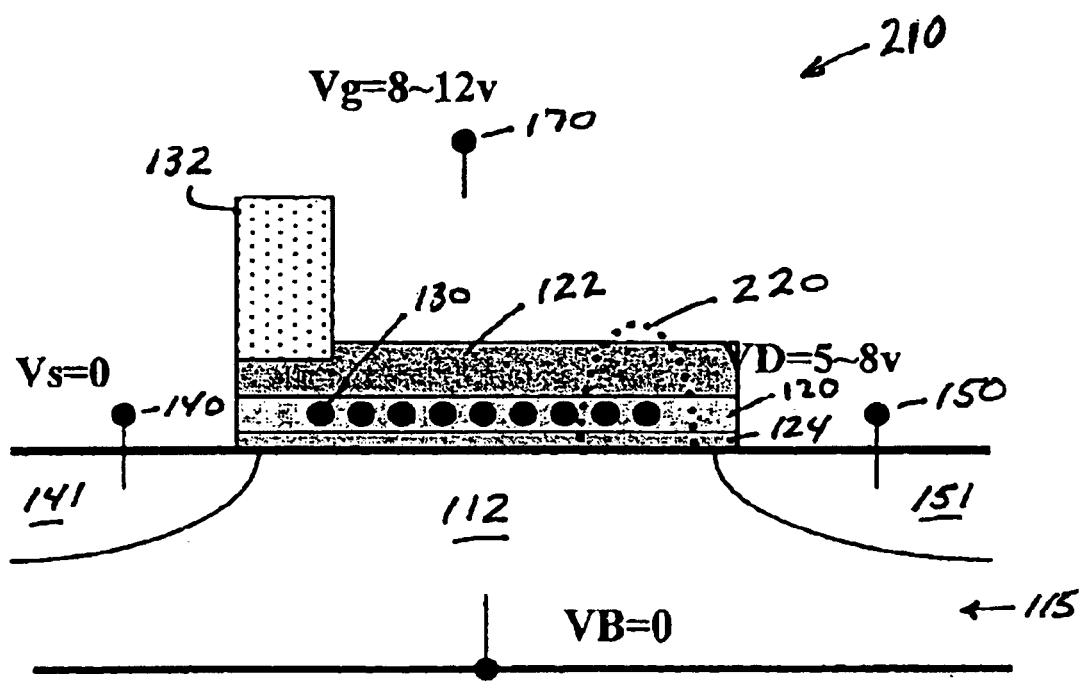
FIG. 2 is a sectional view of a known localized trapped charge memory device structure formed on a semiconductor substrate after programming.

The NROM device 210 of FIG. 2 represents a programmed device, which has been programmed using CHE injection to inject electrons into charge trapping layer 120. The electron trapping occurs in a region near the drain 150 indicated by the phantom line 220 in FIG. 2. Phantom line 220 represents the programmed area of charge trapping layer 120 after a program cycle has been performed, but prior to application of an erase cycle. Electrons 130 are trapped in the portion of charge trapping layer 120 near but above the drain region 151 as a result of, for example, the prior presence of relatively strong electric fields there. The threshold voltage ($V_t$) of the portion of the channel 112 between a source region 141 and the drain region 151 under the region 220 of trapped charge increases as more electrons 130 are injected into the charge trapping layer 120. In modified embodiments, charge trapping layer 120 may comprise other suitable dielectric substances other than silicon nitride, including silicon dioxide with buried polysilicon islands or implanted oxide, or an oxide with a suitable implanted impurity such as arsenic.

The method of reading programmed NROM device 210 will now be described with reference to the exemplary embodiment depicted in the figures. One technique of reading charge trapping layer memory device, such as NROM device 210, is to apply read voltages to the gate 170 and drain 150 and to ground the source 140. This is similar to the method of programming discussed above, with the difference being that lower level voltages are applied during reading than are applied during programming. Since the gate 170 is conductive, the trapped charges (i.e., electrons 130) are distributed evenly throughout the entire conductor. In a programmed NROM device 210 wherein for example both bits are programmed with a '0' value, the threshold is therefore high for the entire channel 112 and the process of reading the NROM device 210 becomes symmetrical. It makes no difference whether voltage is applied to the drain 150 and the source 140 is grounded, or vice versa.

Figure 3:
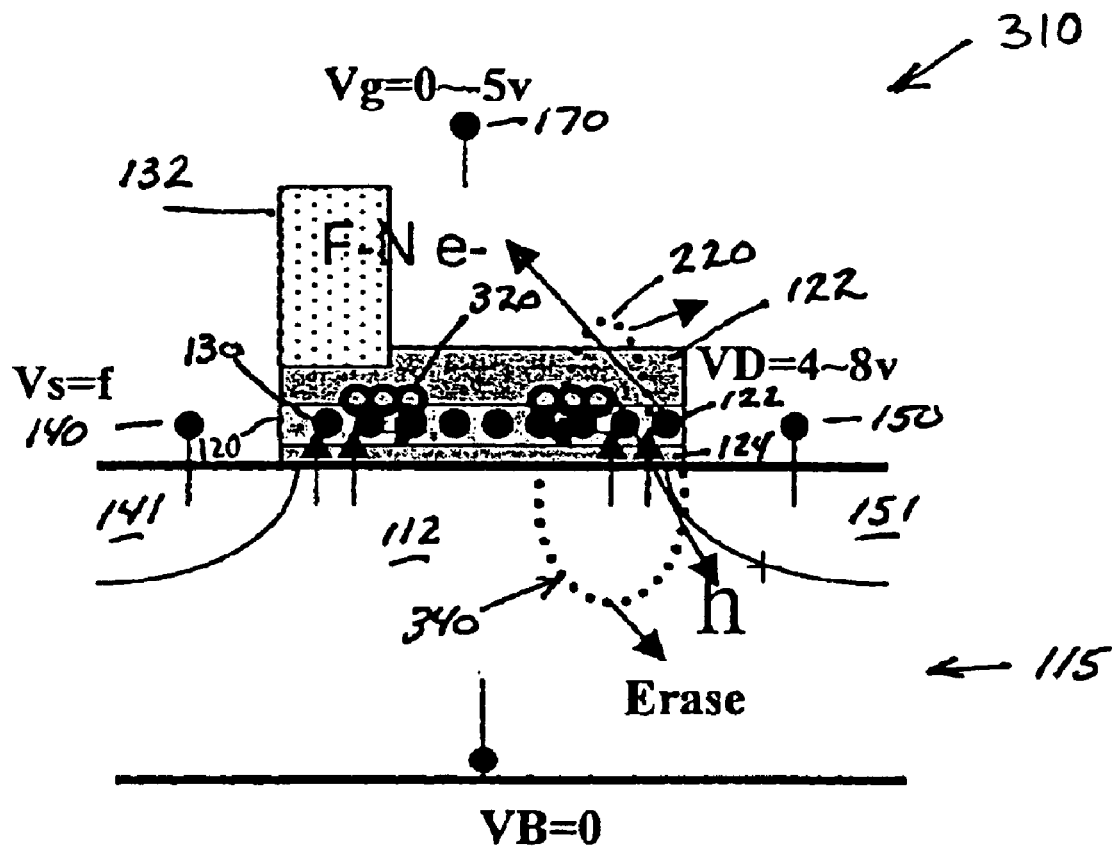
FIG. 3 is a sectional view of a known localized trapped charge memory device structure following application of an embodiment of the present invention.

Turning to FIG. 3, an embodiment of the instant method for minimizing or preventing the over-erase of localized trapped charge memory device structures, which for illustrative purposes is embodied in an NROM device, is now described. In the illustrated embodiment, a programmed NROM memory device has been prepared. The present invention provides a method for performing an erase cycle on the programmed NROM memory device to erase the NROM memory device 310, as illustrated in FIG. 3, which method includes an F-N tunneling program that can overcome an over-erase condition as described above. In other implementations of the present invention, the F-N tunneling program is performed before a program cycle in which the NROM memory device is programmed for example by channel hot electron injection, or before an erase cycle in which the NROM memory device is erased for example by drain hot hole injection.

An erase cycle may involve a protocol for injection of holes into the charge trapping layer 120. One such protocol is a tunneling enhanced hot hole (TEHH) injection mechanism, wherein holes are generated by band-to-band tunneling under the ONO dielectric structure in the junction. Kinetic energies of the holes are increased due to a lateral electric field allowing some holes to be injected into the ONO dielectric structure, assisted by a vertical electric field where they recombine with electrons stored in the charge trapping layer 120 from for example a prior erase operation. The erase cycle may be performed with a positive voltage scheme (e.g. a positive voltage potential from the drain to the source), and zero voltage on the gate. A second option is to apply positive voltage to the drain and negative voltage to the gate, respectively, which may result in faster erase times.

An over-erase condition may be detected in an NROM device by monitoring the threshold voltage ($V_t$) of the device. Once an over-erase condition has been detected as noted above, or for example if an over-erase condition is anticipated, a method of the present invention can provide a conditioning mechanism for eliminating excessive over-erase injected holes 320 which may for example have been caused by a prior drain hot hole injection erase process. In another implementation, a method of the present invention can provide a preconditioning mechanism for eliminating excessive over-erase injected holes 320 which may be caused at a future point in time by a drain hot hole injection erase process.

In a preferred embodiment, the preconditioning method of the present invention is performed automatically before for example a programming operation, or after an erase operation, regardless of the occurrence of an above-mentioned detection or anticipation. For instance, the TEHH injection mentioned above may result in a plurality of over-erase injected holes 320 being distributed in the charge trapping layer 120 for each bit. In such a case, a plurality of electrons 130 may be injected into the charge trapping layer 120 in a preconditioning mechanism step. The preconditioning mechanism introduces the additional electrons 130 to the charge trapping layer 120 to counteract or combine with the over-erase injected holes 320 stored in the charge trapping layer 120 from the earlier erase operation in which for example an excess number of electrons were introduced into the charge trapping layer 120. In accordance with an aspect of the present invention, one such preconditioning mechanism is a Fowler-Nordheim (F-N) tunneling program, which can provide additional electrons 130 to the charge trapping layer 120. These additional electrons 130 move from the channel 112 into the charge trapping layer 120. For instance, implementation of an F-N tunneling program can initiate an injection of electrons from an erase area 340 into a formerly-programmed area 220 (of charge trapping layer 120) which has since been over-erased, wherein the injected electrons can effectively offset the excess holes 320 that were earlier produced by the drain hot hole injection erase process. The reduction, or preferably absence, of excess holes 320 can attenuate, or preferably eliminate, the over-erase condition in the NROM device 310.

The F-N tunneling mechanism may be applied to individual NROM devices, or as a blanket technique to a plurality of NROM devices. The amount and/or duration of F-N tunneling to be applied can be dependent upon several parameters.

Application of this preconditioning mechanism can serve to prepare or precondition the NROM device prior to another program or erase cycle so that for example the threshold voltage is sufficiently increased. The threshold voltage is related to the drain and source bias which accomplishes depletion of the semiconductor channel in relatively short channel devices. Since less gate voltage is required to deplete the semiconductor channel, the potential barrier for electron injection from source to drain decreases. This phenomenon is known as Drain Induced Barrier Lowering (DIBL). The performance limitation of DIBL may occur during either a program cycle or an erase cycle, and can be responsible for the degradation of sub-threshold swing in deep submicron devices such as NROM devices. As noted, DIBL can represent a reduction in the potential barrier between a drain and a source as the channel length between them shortens. When the drain voltage is increased, the depletion region around the drain increases and the drain region electric field reduces the channel potential barrier, which results in an increased off-state current between the source and drain. To prevent DIBL from occurring, the threshold voltage is preferably maintained at a nominal level sufficient to limit the amount of subthreshold leakage current flowing into the drain.

Further, the length of channel 112 may be effectively shortened as a result of the application of the preconditioning mechanism. For example, the channel 112 may be shortened from its original length. These complimentary effects can combine to attenuate or eliminate adverse effects which may stem from over-erase conditions. The preconditioning mechanism may also be applicable to other non-volatile memory devices besides the NROM and localized charge trapping layer memory device embodiments presented herein.

In view of the foregoing, it will be understood by those skilled in the art that the methods of the present invention can facilitate formation of read-only memory devices, and in particular read-only memory devices exhibiting localized charge trapping, in an integrated circuit. The above-described embodiments have been provided by way of example, and the present invention is not limited to these examples. Multiple variations and modifications to the disclosed embodiments will occur, to the extent not mutually exclusive, to those skilled in the art upon consideration of the foregoing description. Additionally, other combinations, omissions, substitutions, and modifications may be apparent to the skilled artisan in view of the disclosure herein. Accordingly, the present invention is not intended to be limited by the disclosed embodiments, but is to be defined by reference to the appended claims.

What is claimed is:

1. A method for enhancing erase of a memory device having a localized trapped charge memory device structure, the method comprising:

providing a memory device, the memory device having a characteristic threshold voltage;

performing a program to increase the threshold voltage of the memory device before a program/erase cycle; and performing the program/erase cycle, the program/erase cycle comprising one or more of a program cycle, an erase cycle, and a process of programming which includes writing followed by reading.

2. The method of claim 1, wherein the program/erase cycle comprises programming the localized trapped charge memory device structure by channel hot electron injection.

3. The method of claim 1, wherein the program/erase cycle comprises erasing the localized trapped charge memory device structure by drain hot hole injection.

4. The method of claim 1, wherein the memory device is a nitride read-only memory (NROM) device.

5. The method of claim 4, wherein the program to increase the threshold voltage is a Fowler-Nordheim tunneling program.

6. The method of claim 5, wherein the program/erase cycle comprises programming the memory device by channel hot electron injection.

7. The method of claim 5, wherein the program/erase cycle comprises erasing the memory device by drain hot hole injection.

8. The method of claim 1, wherein the memory device has a Drain Induced Barrier Lowering (DIBL) characteristic, and further wherein the DIBL characteristic is not induced during the program/erase cycle.

9. The method of claim 1, wherein the memory device comprises a nitride charge trapping layer.

10. The method of claim 1, wherein the performing of a program comprises performing a program to at least partially correct a present or potential over-erase condition by increasing the threshold voltage of the memory device before a program/erase cycle.

11. A method for preventing the over-erase of an NROM device, comprising:

providing an NROM device, the NROM device having a characteristic threshold voltage;

performing a Fowler-Nordheim (F-N) tunneling program to increase the threshold voltage of the NROM device before a program/erase cycle; and performing the program/erase cycle, the program/erase cycle comprising one or more of a program cycle, an erase cycle, and a process of programming which includes writing followed by reading.

12. The method of claim 11, wherein the program/erase cycle comprises programming the NROM device by channel hot electron injection.

13. The method of claim 11, wherein the program/erase cycle comprises erasing the NROM device by drain hot hole injection.

14. The method of claim 11, wherein the performing of an F-N tunneling program comprises performing an F-N tunneling program to at least partially correct a present or potential over-erase condition by increasing the threshold voltage of the NROM device before a program/erase cycle.

* * * * *